(12) United States Patent
Kato et al.

(10) Patent No.: US 8,299,929 B2
(45) Date of Patent: *Oct. 30, 2012

(54) INDUCTIVELY COUPLED MODULE AND ITEM WITH INDUCTIVELY COUPLED MODULE

(75) Inventors: Noboru Kato, Moriyama (JP); Tsuneo Murata, Tokyo-to (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 379 days.

This patent is subject to a terminal disclaimer.

(21) Appl. No.: 12/398,497

(22) Filed: Mar. 5, 2009

(65) Prior Publication Data

US 2009/0160619 A1 Jun. 25, 2009

Related U.S. Application Data

(63) Continuation of application No. PCT/JP2007/066721, filed on Aug. 29, 2007.

(30) Foreign Application Priority Data

Sep. 26, 2006 (JP) ................. 2006-261010

(51) Int. Cl.
*G08B 13/14* (2006.01)

(52) U.S. Cl. ............... 340/572.7; 340/572.8; 343/872; 361/749

(58) Field of Classification Search .......... 340/572.1, 340/572.7, 572.8, 693.5, 10.1; 361/749; 343/872

See application file for complete search history.

(56) References Cited

U.S. PATENT DOCUMENTS

| | | | |
|---|---|---|---|
| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |

(Continued)

FOREIGN PATENT DOCUMENTS

CA 2 279 176 A1 7/1998

(Continued)

OTHER PUBLICATIONS

Kato et al.: "Antenna," U.S. Appl. No. 11/928,502, filed Oct. 30, 2007.

(Continued)

*Primary Examiner* — Thomas Mullen
(74) *Attorney, Agent, or Firm* — Keating & Bennett, LLP

(57) ABSTRACT

An inductively coupled module includes a wireless IC chip and a feeder circuit substrate which is connected to the wireless IC chip and which includes a feeder circuit including an inductance element and a capacitance element. The feeder circuit substrate is made of a biodegradable plastic so as to prevent a negative impact of the module on the environment and the human body. The inductively coupled module is adhered on a radiation plate and is used as a wireless IC device of an RFID system.

6 Claims, 6 Drawing Sheets

U.S. PATENT DOCUMENTS

| | | | |
|---|---|---|---|
| 5,936,150 | A | 8/1999 | Kobrin et al. |
| 5,955,723 | A | 9/1999 | Reiner |
| 5,995,006 | A | 11/1999 | Walsh |
| 6,096,431 | A | 8/2000 | Matsudaira et al. |
| 6,104,611 | A | 8/2000 | Glover et al. |
| 6,107,920 | A | 8/2000 | Eberhardt et al. |
| 6,172,608 | B1 | 1/2001 | Cole |
| 6,181,287 | B1 | 1/2001 | Beigel |
| 6,190,942 | B1 | 2/2001 | Wilm et al. |
| 6,249,258 | B1 | 6/2001 | Bloch et al. |
| 6,259,369 | B1 | 7/2001 | Monico |
| 6,271,803 | B1 | 8/2001 | Watanabe et al. |
| 6,335,686 | B1 | 1/2002 | Goff et al. |
| 6,362,784 | B1 | 3/2002 | Kane et al. |
| 6,367,143 | B1 | 4/2002 | Sugimura |
| 6,378,774 | B1 | 4/2002 | Emori et al. |
| 6,406,990 | B1 | 6/2002 | Kawai |
| 6,437,985 | B1* | 8/2002 | Blanc et al. ............... 340/572.7 |
| 6,448,874 | B1 | 9/2002 | Shiino et al. |
| 6,452,563 | B1 | 9/2002 | Porte |
| 6,462,716 | B1 | 10/2002 | Kushihi |
| 6,542,050 | B1 | 4/2003 | Arai et al. |
| 6,600,459 | B2 | 7/2003 | Yokoshima et al. |
| 6,634,564 | B2 | 10/2003 | Kuramochi |
| 6,664,645 | B2 | 12/2003 | Kawai |
| 6,763,254 | B2 | 7/2004 | Nishikawa |
| 6,812,707 | B2 | 11/2004 | Yonezawa et al. |
| 6,828,881 | B2 | 12/2004 | Mizutani et al. |
| 6,837,438 | B1 | 1/2005 | Takasugi et al. |
| 6,861,731 | B2 | 3/2005 | Buijsman et al. |
| 6,927,738 | B2 | 8/2005 | Senba et al. |
| 6,963,729 | B2 | 11/2005 | Uozumi |
| 7,088,249 | B2 | 8/2006 | Senba et al. |
| 7,088,307 | B2 | 8/2006 | Imaizumi |
| 7,112,952 | B2 | 9/2006 | Arai et al. |
| 7,119,693 | B1 | 10/2006 | Devilbiss |
| 7,129,834 | B2 | 10/2006 | Naruse et al. |
| 7,248,221 | B2 | 7/2007 | Kai et al. |
| 7,250,910 | B2 | 7/2007 | Yoshikawa et al. |
| 7,276,929 | B2 | 10/2007 | Arai et al. |
| 7,317,396 | B2 | 1/2008 | Ujino |
| 7,405,664 | B2 | 7/2008 | Sakama et al. |
| 7,492,326 | B1* | 2/2009 | Bodlovic et al. ........... 340/572.1 |
| 2002/0011967 | A1 | 1/2002 | Goff et al. |
| 2002/0015002 | A1 | 2/2002 | Yasukawa et al. |
| 2002/0044092 | A1 | 4/2002 | Kushihi |
| 2002/0067316 | A1 | 6/2002 | Yokoshima et al. |
| 2002/0093457 | A1 | 7/2002 | Hamada et al. |
| 2003/0006901 | A1 | 1/2003 | Kim et al. |
| 2003/0020661 | A1 | 1/2003 | Sato |
| 2003/0045324 | A1 | 3/2003 | Nagumo et al. |
| 2003/0169153 | A1 | 9/2003 | Muller |
| 2004/0001027 | A1 | 1/2004 | Killen et al. |
| 2004/0026519 | A1 | 2/2004 | Usami et al. |
| 2004/0056823 | A1 | 3/2004 | Zuk et al. |
| 2004/0217915 | A1 | 11/2004 | Imaizumi |
| 2004/0219956 | A1 | 11/2004 | Iwai et al. |
| 2004/0227673 | A1 | 11/2004 | Iwai et al. |
| 2004/0252064 | A1 | 12/2004 | Yuanzhu |
| 2005/0092836 | A1 | 5/2005 | Kudo |
| 2005/0099337 | A1 | 5/2005 | Takei et al. |
| 2005/0125093 | A1 | 6/2005 | Kikuchi et al. |
| 2005/0134460 | A1 | 6/2005 | Usami |
| 2005/0134506 | A1 | 6/2005 | Egbert |
| 2005/0138798 | A1 | 6/2005 | Sakama et al. |
| 2005/0140512 | A1 | 6/2005 | Sakama et al. |
| 2005/0232412 | A1 | 10/2005 | Ichihara et al. |
| 2005/0236623 | A1 | 10/2005 | Takechi et al. |
| 2005/0275539 | A1 | 12/2005 | Sakama et al. |
| 2006/0001138 | A1 | 1/2006 | Sakama et al. |
| 2006/0032926 | A1 | 2/2006 | Baba et al. |
| 2006/0044192 | A1 | 3/2006 | Egbert |
| 2006/0055601 | A1 | 3/2006 | Kameda et al. |
| 2006/0071084 | A1 | 4/2006 | Detig et al. |
| 2006/0109185 | A1 | 5/2006 | Iwai et al. |
| 2006/0158380 | A1 | 7/2006 | Son et al. |
| 2006/0202830 | A1* | 9/2006 | Scharfeld et al. ........... 340/572.7 |
| 2006/0214801 | A1 | 9/2006 | Murofushi et al. |
| 2006/0220871 | A1 | 10/2006 | Baba et al. |
| 2006/0244676 | A1 | 11/2006 | Uesaka |
| 2006/0267138 | A1 | 11/2006 | Kobayashi |
| 2007/0004028 | A1 | 1/2007 | Lair et al. |
| 2007/0018893 | A1 | 1/2007 | Kai et al. |
| 2007/0040028 | A1 | 2/2007 | Kawamata |
| 2007/0052613 | A1 | 3/2007 | Gallschuetz et al. |
| 2007/0057854 | A1 | 3/2007 | Oodachi et al. |
| 2007/0069037 | A1 | 3/2007 | Kawai |
| 2007/0132591 | A1 | 6/2007 | Khatri |
| 2007/0164414 | A1 | 7/2007 | Dokai et al. |
| 2007/0200782 | A1 | 8/2007 | Hayama et al. |
| 2007/0229276 | A1 | 10/2007 | Yamagajo et al. |
| 2007/0247387 | A1 | 10/2007 | Kubo et al. |
| 2007/0252700 | A1 | 11/2007 | Ishihara et al. |
| 2007/0252703 | A1 | 11/2007 | Kato et al. |
| 2007/0285335 | A1 | 12/2007 | Bungo et al. |
| 2007/0290928 | A1 | 12/2007 | Chang et al. |
| 2008/0012709 | A1* | 1/2008 | Stobbe et al. ............... 340/572.1 |
| 2008/0024156 | A1 | 1/2008 | Arai et al. |
| 2008/0143630 | A1 | 6/2008 | Kato et al. |
| 2008/0169905 | A1 | 7/2008 | Slatter |
| 2008/0272885 | A1 | 11/2008 | Atherton |
| 2009/0002130 | A1 | 1/2009 | Kato |
| 2009/0009007 | A1 | 1/2009 | Kato et al. |
| 2009/0021352 | A1 | 1/2009 | Kataya et al. |
| 2009/0021446 | A1 | 1/2009 | Kataya et al. |
| 2009/0065594 | A1 | 3/2009 | Kato et al. |
| 2009/0109102 | A1 | 4/2009 | Dokai et al. |
| 2009/0160719 | A1 | 6/2009 | Kato et al. |
| 2009/0201116 | A1 | 8/2009 | Orihara |
| 2009/0224061 | A1 | 9/2009 | Kato et al. |
| 2009/0231106 | A1 | 9/2009 | Okamura |
| 2009/0262041 | A1 | 10/2009 | Ikemoto et al. |
| 2009/0278687 | A1 | 11/2009 | Kato |
| 2009/0321527 | A1 | 12/2009 | Kato et al. |
| 2010/0103058 | A1 | 4/2010 | Kato et al. |
| 2011/0031320 | A1 | 2/2011 | Kato et al. |
| 2011/0063184 | A1 | 3/2011 | Furumura et al. |

FOREIGN PATENT DOCUMENTS

| | | |
|---|---|---|
| DE | 695 29 030 T2 | 7/2003 |
| DE | 10 2006 057 369 A1 | 6/2008 |
| EP | 0 694 874 A2 | 1/1996 |
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 703 589 A1 | 9/2006 |
| EP | 1 744 398 A1 | 1/2007 |
| EP | 1 841 005 A1 | 10/2007 |
| EP | 1 865 574 A1 | 12/2007 |
| EP | 1 976 056 A1 | 10/2008 |
| EP | 1 988 491 A1 | 11/2008 |
| EP | 1 993 170 A1 | 11/2008 |
| EP | 2 009 738 A1 | 12/2008 |
| EP | 2 012 258 A1 | 1/2009 |
| EP | 2 148 449 A1 | 1/2010 |
| EP | 2 251 934 A1 | 11/2010 |
| GB | 2 305 075 A | 3/1997 |
| GB | 2461443 | 1/2010 |
| JP | 50-143451 A | 11/1975 |
| JP | 61-284102 A | 12/1986 |
| JP | 62-127140 U | 8/1987 |
| JP | 02-164105 A | 6/1990 |
| JP | 02-256208 A | 10/1990 |
| JP | 03-503467 A | 8/1991 |
| JP | 03-262313 A | 11/1991 |
| JP | 04-150011 A | 5/1992 |

| | | | | | | |
|---|---|---|---|---|---|---|
| JP | 04-167500 | A | 6/1992 | JP | 3075400 U | 11/2000 |
| JP | 04-096814 | U | 8/1992 | JP | 2000-349680 A | 12/2000 |
| JP | 04-101168 | U | 9/1992 | JP | 2001-10264 A | 1/2001 |
| JP | 04-134807 | U | 12/1992 | JP | 2001-028036 A | 1/2001 |
| JP | 05-327331 | A | 12/1993 | JP | 2007-18067 A | 1/2001 |
| JP | 6-53733 | A | 2/1994 | JP | 2001-043340 A | 2/2001 |
| JP | 06-077729 | A | 3/1994 | JP | 2001-66990 A | 3/2001 |
| JP | 06-177635 | A | 6/1994 | JP | 2001-76111 A | 3/2001 |
| JP | 6-260949 | A | 9/1994 | JP | 2001-101369 A | 4/2001 |
| JP | 07-183836 | A | 7/1995 | JP | 2001-505682 A | 4/2001 |
| JP | 08-055725 | A | 2/1996 | JP | 2001-168628 A | 6/2001 |
| JP | 08-056113 | A | 2/1996 | JP | 2001-188890 A | 7/2001 |
| JP | 8-87580 | A | 4/1996 | JP | 2001-240046 A | 9/2001 |
| JP | 08-088586 | A | 4/1996 | JP | 2001-256457 A | 9/2001 |
| JP | 08-88586 | A | 4/1996 | JP | 2001-257292 A | 9/2001 |
| JP | 08-176421 | A | 7/1996 | JP | 2001-514777 A | 9/2001 |
| JP | 08-180160 | A | 7/1996 | JP | 2001-319380 A | 11/2001 |
| JP | 08-279027 | A | 10/1996 | JP | 2001-331976 A | 11/2001 |
| JP | 08-307126 | A | 11/1996 | JP | 2001-332923 A | 11/2001 |
| JP | 08-330372 | A | 12/1996 | JP | 2001-339226 A | 12/2001 |
| JP | 09-014150 | A | 1/1997 | JP | 2001-344574 A | 12/2001 |
| JP | 09-035025 | A | 2/1997 | JP | 2001-351083 A | 12/2001 |
| JP | 9-93029 | A | 4/1997 | JP | 2001-351084 A | 12/2001 |
| JP | 09-093029 | A | 4/1997 | JP | 2001-352176 A | 12/2001 |
| JP | 09-245381 | A | 9/1997 | JP | 2002-024776 A | 1/2002 |
| JP | 09-252217 | A | 9/1997 | JP | 2002-026513 A | 1/2002 |
| JP | 09-270623 | A | 10/1997 | JP | 2002-32731 A | 1/2002 |
| JP | 09-284038 | A | 10/1997 | JP | 2002-042076 A | 2/2002 |
| JP | 9-512367 | A | 12/1997 | JP | 2002-063557 A | 2/2002 |
| JP | 10-069533 | A | 3/1998 | JP | 2002-505645 A | 2/2002 |
| JP | 10-69533 | A | 3/1998 | JP | 2002-076750 A | 3/2002 |
| JP | 10-505466 | A | 5/1998 | JP | 2002-76750 A | 3/2002 |
| JP | 10-171954 | A | 6/1998 | JP | 2002-111363 A | 4/2002 |
| JP | 10-173427 | A | 6/1998 | JP | 2002-150245 A | 5/2002 |
| JP | 10-193849 | A | 7/1998 | JP | 2002-157564 A | 5/2002 |
| JP | 10-193851 | A | 7/1998 | JP | 2002-158529 A | 5/2002 |
| JP | 10-293828 | A | 11/1998 | JP | 2002-175508 A | 6/2002 |
| JP | 11-025244 | A | 1/1999 | JP | 2002-183690 A | 6/2002 |
| JP | 11-039441 | A | 2/1999 | JP | 2002-185358 A | 6/2002 |
| JP | 11-075329 | A | 3/1999 | JP | 2002-204117 A | 7/2002 |
| JP | 11-085937 | A | 3/1999 | JP | 2002-522849 A | 7/2002 |
| JP | 11-88241 | A | 3/1999 | JP | 2002-230128 A | 8/2002 |
| JP | 11-102424 | A | 4/1999 | JP | 2002-232221 A | 8/2002 |
| JP | 11-103209 | A | 4/1999 | JP | 2002-252117 A | 9/2002 |
| JP | 11-149536 | A | 6/1999 | JP | 2002-259934 A | 9/2002 |
| JP | 11-149537 | A | 6/1999 | JP | 2002-280821 A | 9/2002 |
| JP | 11-149538 | A | 6/1999 | JP | 2002-298109 A | 10/2002 |
| JP | 11-175678 | A | 7/1999 | JP | 2002-308437 A | 10/2002 |
| JP | 11-219420 | A | 8/1999 | JP | 2002-319008 A | 10/2002 |
| JP | 11-220319 | A | 8/1999 | JP | 2002-319009 A | 10/2002 |
| JP | 11-282993 | A | 10/1999 | JP | 2002-319812 A | 10/2002 |
| JP | 11-328352 | A | 11/1999 | JP | 2002-362613 A | 12/2002 |
| JP | 11-331014 | A | 11/1999 | JP | 2002-366917 A | 12/2002 |
| JP | 11-346114 | A | 12/1999 | JP | 2002-373029 A | 12/2002 |
| JP | 11-515094 | A | 12/1999 | JP | 2002-373323 A | 12/2002 |
| JP | 2000-21128 | A | 1/2000 | JP | 2002-374139 A | 12/2002 |
| JP | 2000-021639 | A | 1/2000 | JP | 2003-006599 A | 1/2003 |
| JP | 2000-022421 | A | 1/2000 | JP | 2003-016412 A | 1/2003 |
| JP | 2000-059260 | A | 2/2000 | JP | 2003-022912 A | 1/2003 |
| JP | 2000-085283 | A | 3/2000 | JP | 2003-026177 A | 1/2003 |
| JP | 2000-090207 | A | 3/2000 | JP | 2003-030612 A | 1/2003 |
| JP | 2000-132643 | A | 5/2000 | JP | 2003-44789 A | 2/2003 |
| JP | 2000-137778 | A | 5/2000 | JP | 2003-046318 A | 2/2003 |
| JP | 2000-137779 | A | 5/2000 | JP | 2003-58840 A | 2/2003 |
| JP | 2000-137785 | A | 5/2000 | JP | 2003-067711 A | 3/2003 |
| JP | 2000-148948 | A | 5/2000 | JP | 2003-069335 A | 3/2003 |
| JP | 2000-172812 | A | 6/2000 | JP | 2003-076947 A | 3/2003 |
| JP | 2000-209013 | A | 7/2000 | JP | 2003-76963 A | 3/2003 |
| JP | 2000-222540 | A | 8/2000 | JP | 2003-78333 A | 3/2003 |
| JP | 2000-510271 | A | 8/2000 | JP | 2003-078336 A | 3/2003 |
| JP | 2000-242754 | A | 9/2000 | JP | 2003-085501 A | 3/2003 |
| JP | 2000-243797 | A | 9/2000 | JP | 2003-085520 A | 3/2003 |
| JP | 2000-251049 | A | 9/2000 | JP | 2003-87008 A | 3/2003 |
| JP | 2000-261230 | A | 9/2000 | JP | 2003-87044 A | 3/2003 |
| JP | 2000-276569 | A | 10/2000 | JP | 2003-099720 A | 4/2003 |
| JP | 2000-286634 | A | 10/2000 | JP | 2003-099721 A | 4/2003 |
| JP | 2000-286760 | A | 10/2000 | JP | 2003-110344 A | 4/2003 |
| JP | 2000-311226 | A | 11/2000 | JP | 2003-132330 A | 5/2003 |
| JP | 2000-321984 | A | 11/2000 | JP | 2003-134007 A | 5/2003 |

| | | | | | | | |
|---|---|---|---|---|---|---|---|
| JP | 2003-155062 | A | 5/2003 | JP | 2005-322119 | A | 11/2005 |
| JP | 2003-158414 | A | 5/2003 | JP | 2005-335755 | A | 12/2005 |
| JP | 2003-168760 | A | 6/2003 | JP | 2005-340759 | A | 12/2005 |
| JP | 2003-179565 | A | 6/2003 | JP | 2005-345802 | A | 12/2005 |
| JP | 2003-187207 | A | 7/2003 | JP | 2005-346820 | A | 12/2005 |
| JP | 2003-187211 | A | 7/2003 | JP | 2005-352858 | A | 12/2005 |
| JP | 2003-188338 | A | 7/2003 | JP | 2006-013976 | A | 1/2006 |
| JP | 2003-188620 | A | 7/2003 | JP | 2006-13976 | A | 1/2006 |
| JP | 2003-198230 | A | 7/2003 | JP | 2006-025390 | A | 1/2006 |
| JP | 2003-209421 | A | 7/2003 | JP | 2006-031766 | A | 2/2006 |
| JP | 2003-216919 | A | 7/2003 | JP | 2006-033312 | A | 2/2006 |
| JP | 2003-218624 | A | 7/2003 | JP | 2006-39902 | A | 2/2006 |
| JP | 2003-233780 | A | 8/2003 | JP | 2006-039947 | A | 2/2006 |
| JP | 2003-242471 | A | 8/2003 | JP | 2006-42059 | A | 2/2006 |
| JP | 2003-243918 | A | 8/2003 | JP | 2006-42097 | A | 2/2006 |
| JP | 2003-249813 | A | 9/2003 | JP | 2006-053833 | A | 2/2006 |
| JP | 2003-529163 | A | 9/2003 | JP | 2006-67479 | A | 3/2006 |
| JP | 2003-288560 | A | 10/2003 | JP | 2006-72706 | A | 3/2006 |
| JP | 2003-309418 | A | 10/2003 | JP | 2006-80367 | A | 3/2006 |
| JP | 2003-317060 | A | 11/2003 | JP | 2006-92630 | A | 4/2006 |
| JP | 2003-331246 | A | 11/2003 | JP | 2006-102953 | A | 4/2006 |
| JP | 2003-332820 | A | 11/2003 | JP | 2006-107296 | A | 4/2006 |
| JP | 2003-536302 | A | 12/2003 | JP | 2006-513594 | A | 4/2006 |
| JP | 2004-040597 | A | 2/2004 | JP | 2006-148462 | A | 6/2006 |
| JP | 2004-505481 | A | 2/2004 | JP | 2006-148518 | A | 6/2006 |
| JP | 2004-082775 | A | 3/2004 | JP | 2006-151402 | A | 6/2006 |
| JP | 2004-88218 | A | 3/2004 | JP | 2006-174151 | A | 6/2006 |
| JP | 2004-93693 | A | 3/2004 | JP | 2006-195795 | A | 7/2006 |
| JP | 2004-096566 | A | 3/2004 | JP | 2006-203187 | A | 8/2006 |
| JP | 2004-127230 | A | 4/2004 | JP | 2006-203852 | A | 8/2006 |
| JP | 2004-140513 | A | 5/2004 | JP | 2006-217000 | A | 8/2006 |
| JP | 2004-213582 | A | 7/2004 | JP | 2006-232292 | A | 9/2006 |
| JP | 2004-519916 | A | 7/2004 | JP | 2006-237674 | A | 9/2006 |
| JP | 2004-234595 | A | 8/2004 | JP | 2006-270212 | A | 10/2006 |
| JP | 2004-253858 | A | 9/2004 | JP | 2006-270681 | A | 10/2006 |
| JP | 2004-527864 | A | 9/2004 | JP | 2006-270766 | A | 10/2006 |
| JP | 2004-280390 | A | 10/2004 | JP | 2006-285911 | A | 10/2006 |
| JP | 2004-282403 | A | 10/2004 | JP | 2006-295879 | A | 10/2006 |
| JP | 2004-287767 | A | 10/2004 | JP | 2006-302219 | A | 11/2006 |
| JP | 2004-297249 | A | 10/2004 | JP | 2006-309401 | A | 11/2006 |
| JP | 2004-297681 | A | 10/2004 | JP | 2006-311239 | A | 11/2006 |
| JP | 2004-304370 | A | 10/2004 | JP | 2006-323481 | A | 11/2006 |
| JP | 2004-319848 | A | 11/2004 | JP | 2006-339964 | A | 12/2006 |
| JP | 2004-326380 | A | 11/2004 | JP | 2007-007888 | A | 1/2007 |
| JP | 2004-334268 | A | 11/2004 | JP | 2007-13120 | A | 1/2007 |
| JP | 2004-336250 | A | 11/2004 | JP | 2007-28002 | A | 2/2007 |
| JP | 2004-343000 | A | 12/2004 | JP | 2007-043535 | A | 2/2007 |
| JP | 2004-362190 | A | 12/2004 | JP | 2007-048126 | A | 2/2007 |
| JP | 2004-362341 | A | 12/2004 | JP | 2007-65822 | A | 3/2007 |
| JP | 2004-362602 | A | 12/2004 | JP | 2007-79687 | A | 3/2007 |
| JP | 2005-5866 | A | 1/2005 | JP | 2007-81712 | A | 3/2007 |
| JP | 2005-18156 | A | 1/2005 | JP | 2007-096768 | A | 4/2007 |
| JP | 2005-033461 | A | 2/2005 | JP | 2007-102348 | A | 4/2007 |
| JP | 2005-124061 | A | 5/2005 | JP | 2007-116347 | A | 5/2007 |
| JP | 2005-128592 | A | 5/2005 | JP | 2007-122542 | A | 5/2007 |
| JP | 2005-129019 | A | 5/2005 | JP | 2007-150642 | A | 6/2007 |
| JP | 2005-135132 | A | 5/2005 | JP | 2007-150868 | A | 6/2007 |
| JP | 2005-136528 | A | 5/2005 | JP | 2007-159083 | A | 6/2007 |
| JP | 2005-137032 | A | 5/2005 | JP | 2007-159129 | A | 6/2007 |
| JP | 3653099 | B2 | 5/2005 | JP | 2007-166133 | A | 6/2007 |
| JP | 2005-165839 | A | 6/2005 | JP | 2007-172369 | A | 7/2007 |
| JP | 2005-167327 | A | 6/2005 | JP | 2007-172527 | A | 7/2007 |
| JP | 2005-167813 | A | 6/2005 | JP | 2007-228325 | A | 9/2007 |
| JP | 2005-190417 | A | 7/2005 | JP | 2007-266999 | A | 10/2007 |
| JP | 2005-191705 | A | 7/2005 | JP | 2007-272264 | A | 10/2007 |
| JP | 2005-192124 | A | 7/2005 | JP | 2007-287128 | A | 11/2007 |
| JP | 2005-210676 | A | 8/2005 | JP | 2007-295557 | A | 11/2007 |
| JP | 2005-210680 | A | 8/2005 | JP | 2007-312350 | A | 11/2007 |
| JP | 2005-217822 | A | 8/2005 | JP | 2007-324865 | A | 12/2007 |
| JP | 2005-229474 | A | 8/2005 | JP | 2008-033716 | A | 2/2008 |
| JP | 2005-236339 | A | 9/2005 | JP | 2008-72243 | A | 3/2008 |
| JP | 2005-244778 | A | 9/2005 | JP | 2008-083867 | A | 4/2008 |
| JP | 2005-252853 | A | 9/2005 | JP | 2008-097426 | A | 4/2008 |
| JP | 2005-275870 | A | 10/2005 | JP | 4069958 | B2 | 4/2008 |
| JP | 2005-284352 | A | 10/2005 | JP | 2008-107947 | A | 5/2008 |
| JP | 2005-293537 | A | 10/2005 | JP | 2008-148345 | A | 6/2008 |
| JP | 2005-295135 | A | 10/2005 | JP | 2008-519347 | A | 6/2008 |
| JP | 2005-311205 | A | 11/2005 | JP | 2008-160874 | A | 7/2008 |
| JP | 2005-321305 | A | 11/2005 | JP | 2008-197714 | A | 8/2008 |

| | | | |
|---|---|---|---|
| JP | 2008-288915 A | 11/2008 | |
| JP | 2009-017284 A | 1/2009 | |
| JP | 2009-25870 A | 2/2009 | |
| JP | 2009-27291 A | 2/2009 | |
| JP | 2009-044715 A | 2/2009 | |
| JP | 3148168 U | 2/2009 | |
| JP | 2009-182630 A | 8/2009 | |
| JP | 2010-009196 A | 1/2010 | |
| JP | 4609604 B2 | 1/2011 | |
| NL | 9100176 A | 3/1992 | |
| NL | 9100347 A | 3/1992 | |
| WO | 98/33142 A1 | 7/1998 | |
| WO | 99/67754 A1 | 12/1999 | |
| WO | 00/10122 A2 | 2/2000 | |
| WO | 01/95242 A2 | 12/2001 | |
| WO | 02/48980 A1 | 6/2002 | |
| WO | 02/061675 A1 | 8/2002 | |
| WO | 02/097723 A1 | 12/2002 | |
| WO | 03/079305 A1 | 9/2003 | |
| WO | 2004/036772 A1 | 4/2004 | |
| WO | 2004/070879 A | 8/2004 | |
| WO | 2004/072892 A1 | 8/2004 | |
| WO | 2005/073937 A | 8/2005 | |
| WO | 2005/091434 A1 | 9/2005 | |
| WO | 2005/115849 A1 | 12/2005 | |
| WO | 2006/045682 A | 5/2006 | |
| WO | 2006/048663 A1 | 5/2006 | |
| WO | 2006/114821 A1 | 11/2006 | |
| WO | 2007/083574 A1 | 7/2007 | |
| WO | 2007/083575 A1 | 7/2007 | |
| WO | 2007/086130 A1 | 8/2007 | |
| WO | 2007/097385 A1 | 8/2007 | |
| WO | 2007/102360 A1 | 9/2007 | |
| WO | 2007/105348 A1 | 9/2007 | |
| WO | 2007/119310 A1 | 10/2007 | |
| WO | 2007/125683 A1 | 11/2007 | |
| WO | 2007/138857 A1 | 12/2007 | |
| WO | 2008/007606 A | 1/2008 | |
| WO | 2008/081699 A1 | 7/2008 | |
| WO | 2008/126458 A1 | 10/2008 | |
| WO | 2008/133018 A1 | 11/2008 | |
| WO | 2008/140037 A1 | 11/2008 | |
| WO | 2008/142957 A1 | 11/2008 | |
| WO | 2009/011144 A1 | 1/2009 | |
| WO | 2009/011376 A1 | 1/2009 | |
| WO | 2009/011423 A1 | 1/2009 | |
| WO | 2009/081719 A1 | 7/2009 | |
| WO | 2009/110381 A1 | 9/2009 | |

OTHER PUBLICATIONS

Kato et al.: Wireless IC Device, U.S. Appl. No. 12/211,117, filed Sep. 16, 2008.
Kato et al.: "Antenna," U.S. Appl. No. 11/688,290, filed Mar. 20, 2007.
Kato et al.: "Electromagnetic-Coupling-Module-Attached Article," U.S. Appl. No. 11/740,509, filed Apr. 26, 2007.
Kato et al.: "Product Including Power Supply Circuit Board," U.S. Appl. No. 12/234,949, filed Sep. 22, 2008.
Kato et al.: "Data Coupler," U.S. Appl. No. 12/252,475, filed Oct. 16, 2008.
Kato et al.; "Information Terminal Device," U.S. Appl. No. 12/267,666, filed Nov. 10, 2008.
Kato et al.: "Wireless IC Device and Wireless IC Device Composite Component," U.S. Appl. No. 12/276,444, filed Nov. 24, 2008.
Dokai et al.: "Optical Disc," U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System," U.S. Appl. No. 12/274,400, filed Nov. 20, 2008.
Kato: "Wireless IC Device," U.S. Appl. No. 11/964,185, filed Dec. 26, 2007.
Kato et al.: "Radio Frequency IC Device," U.S. Appl. No. 12/336,629, filed Dec. 17, 2008.
Kato et al.: "Wireless IC Device and Component for Wireless IC Device," U.S. Appl. No. 12/339,198, filed Dec. 19, 2008.
Ikemoto et al.: "Wireless IC Device," U.S. Appl. No. 11/851,651, filed Sep. 7, 2007.
Kataya et al.: "Wireless IC Device and Electronic Device," U.S. Appl. No. 11/851,661, filed Sep. 7, 2007.
Dokai et al.: "Antenna and Radio IC Device," U.S. Appl. No. 12/350,307, filed Jan. 8, 2009.
Dokai et al.: "Wireless IC Device and Component for Wireless IC Device," U.S. Appl. No. 11/624,382, filed Jan. 18, 2007.
Dokai et al.: "Wireless IC Device, and Component for Wireless IC Device," U.S. Appl. No. 11/930,818, filed Oct. 31, 2007.
Kato et al.: "Wireless IC Device," U.S. Appl. No. 12/042,399, filed Mar. 5, 2008.
Dokai et al.: "Wireless IC Device and Component for Wireless IC Device," U.S. Appl. No. 12/359,690, filed Jan. 26, 2009.
Dokai et al.: "Test System for Radio Frequency IC Devices and Method of Manufacturing Radio Frequency IC Devices Using the Same," U.S. Appl. No. 12/388,826, filed Feb. 19, 2009.
Official Communication issued in International Application No. PCT/JP2007/066721, mailed on Nov. 27, 2007.
Official Communication issued in corresponding German Patent Application No. 11 2007 002 024.5 mailed on Aug. 13, 2009.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.
Kato et al.: "Antenna Device and Method of Setting Resonant Frequency of Antenna Device"; U.S. Appl. No. 13/272,365, filed Oct. 13, 2011.
Official Communication issued in International Patent Application No. PCT/JP2010/056812, mailed on Jul. 13, 2010.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Official communication issued in related U.S. Appl. No. 12/042,399; mailed on Aug. 25, 2008.
English translation of NL9100176, published on Mar. 2, 1992.
English translation of NL9100347, published on Mar. 2, 1992.
Official Communication issued in International Application No. PCT/JP2007/066007, mailed on Nov. 27, 2007.
Official Communication issued in International Application No. PCT/JP2008/061955, mailed on Sep. 30, 2008.
Official Communication issued in International Application No. PCT/JP2007/070460, mailed on Dec. 11, 2007.
Kato et al.: "Wireless IC Device"U.S. Appl. No. 12/390,556, filed Feb. 23, 2009.
Kato et al.: "Inductively Coupled Module and Item With Inductively Coupled Module"U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"U.S. Appl. No. 12/401,767, filed Mar. 11, 2009.
Taniguchi et al.: "Antenna Device and Radio Frequency IC Device"U.S. Appl. No. 12/326,117, filed Dec. 2, 2008.

Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/056026, mailed Jul. 1, 2008.
Ikemoto et al.: "Wireless IC Device and Electronic Apparatus," U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device," U.S. Appl. No. 12/510,338, filed Jul. 28, 2009.
Kato et al.: "Wireless IC Device," U.S. Appl. No. 12/510,340, filed Jul. 28, 2009.
Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module," U.S. Appl. No. 12/536,663, filed Aug. 6, 2009.
Osamura et al.: "Packaging Material With Electromagnetic Coupling Module," U.S. Appl. No. 12/536,669, filed Aug. 6, 2009.
Dokai et al.: "Wireless IC Device and Component for Wireless IC Device," U.S. Appl. No. 12/543,553, filed Aug. 19, 2009.
Shioya et al.: "Wireless IC Device," U.S. Appl. No. 12/551,037, filed Aug. 31, 2009.
Ikemoto: "Wireless IC Device and Manufacturing Method Thereof," U.S. Appl. No. 12/579,672, filed Oct. 15, 2009.
Official communication issued in International Application No. PCT/JP2008/058614, mailed on Jun. 10, 2008.
Official Communication issued in International Patent Application No. PCT/JP2008/063025, mailed on Aug. 12, 2008.
Kato et al.: "Wireless IC Device," U.S. Appl. No. 12/603,608, filed Oct. 22, 2009.
Kato et al.: "Wireless IC Device," U.S. Appl. No. 12/688,072, filed Jan. 15, 2010.
Official Communication issued in International Patent Application No. PCT/JP2009/053693, mailed on Jun. 9, 2009.
Kato: "Composite Antenna," U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device," U.S. Appl. No. 12/861,945, filed Aug. 24, 2010.
Kato: "Wireless IC Device and Electromagnetic Coupling Module," U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device" U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626; filed Apr. 11, 2011.
Official Communication issued in International Patent Application No. PCT/JP2009/070617, mailed on Mar. 16, 2010.
Nagai, "Mounting Technique of RRID by Roll-To-Roll Process", Material Stage, Technical Information Institute Co., Ltd, vol. 7, No. 9, 2007, pp. 4-12.
Dokai et al.: "Wireless IC Device"; U.S. Appl. No. 13/088,480; filed Apr. 18, 2011.
Kato et al.: "High-Frequency Device and Wireless IC Device": U.S. Appl. No. 13/094,928, filed Apr. 27, 2011.
Dokai et al.: "Wireless IC Device"; U.S. Appl. No. 13/099, 392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.

Kato et al.: "Component of Wireless IC Device and Wireless IC Device"; U.S. Appl. No. 12/944,099; filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.

Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.

* cited by examiner

INDUCTIVELY COUPLED MODULE AND ITEM WITH INDUCTIVELY COUPLED MODULE

BACKGROUND OF THE INVENTION

1. Field of the Invention

The present invention relates to an inductively coupled module, and more particularly to an inductively coupled module for a wireless IC device and an including the inductively coupled module to be used in an RFID (Radio Frequency Identification) system.

2. Description of the Related Art

Recently, as an item management system, an RFID system to send and receive information has been developed in which communication is performed in a non-contact manner between a reader/writer that generates an induction field and a wireless tag (hereinafter referred to as a wireless IC device) that is attached to an item and in which predetermined information is stored.

A known wireless IC device to be used in the RFID system is described in Japanese Unexamined Patent Application Publication No. 2002-63557, for example. The wireless IC device includes a wireless IC chip in which information is recorded, a matching circuit arranged to match the wireless IC chip and an antenna, and a case. These components are made of resin, metal, or other materials, and thus, when an item including the device is discarded, the device is also discarded at the same time. This causes environmental damage and pollution. Moreover, if a wireless IC device is attached to a package or a container of food or drink and is inadvertently mixed into the food or drink, then the wireless IC device may be accidentally swallowed which could have a negative effect on the human body.

SUMMARY OF THE INVENTION

To overcome the problems described above, preferred embodiments of the present invention provide an inductively coupled module that prevents a negative impact of the inductively coupled module on the environment and the human body and an item including the inductively coupled module, wherein the inductively coupled module is used in a wireless IC device.

An inductively coupled module according to a first preferred embodiment of the present invention includes a wireless IC chip and a feeder circuit substrate which is connected to the wireless IC chip and in which a feeder circuit including an inductance element is provided, and at least one of the wireless IC chip and the feeder circuit substrate is made of a biodegradable plastic.

A plant-derived aliphatic plastic, a natural plastic, and a bioplastic can preferably be used as the biodegradable plastic, for example. These biodegradable plastics do not cause environmental damage and pollution. Furthermore, even if the biodegradable plastic is accidentally swallowed, there is no concern regarding a negative impact of the biodegradable plastic on the human body.

In the inductively coupled module according to the first preferred embodiment invention, the feeder circuit substrate may preferably be a multilayer substrate including a plurality of stacked biodegradable plastic layers, or may preferably be a single-layer substrate made of a biodegradable plastic. The inductance element is disposed on a surface and/or in the interior of the multilayer substrate, or is disposed on a surface of the single-layer substrate. In addition, the feeder circuit substrate may be rigid or flexible. When the feeder circuit substrate is flexible, attachment of an inductively coupled module to an item is facilitated.

An item with an inductively coupled module according to a second preferred embodiment of the present invention includes a radiation plate to which the inductively coupled module is adhered and which emits a transmission signal supplied from the feeder circuit of the inductively coupled module through inductive coupling and/or supplies a received reception signal to the feeder circuit through inductive coupling. The radiation plate may preferably be a metal object of the item itself. The radiation plate may preferably be a package or a container for food, drink, or medicine.

According to preferred embodiments of the present invention, since at least one of a wireless IC chip and a feeder circuit substrate is made of a biodegradable plastic, environmental damage and pollution is prevented, and a negative impact on the human body is prevented when it is accidentally swallowed.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
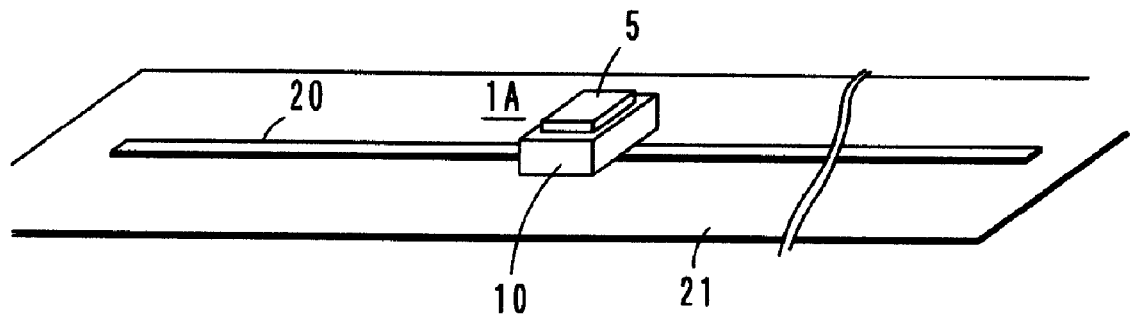
FIG. 1 is a perspective view showing a wireless IC device that includes an inductively coupled module according to a first preferred embodiment of the present invention.

An inductively coupled module and an item including the inductively coupled module according to preferred embodiments of the present invention will be described with reference to the attached drawings. In the following preferred embodiments, common components and portions will be denoted by the same reference numerals and a redundant description thereof will be omitted.

First Preferred Embodiment

Figure 2:
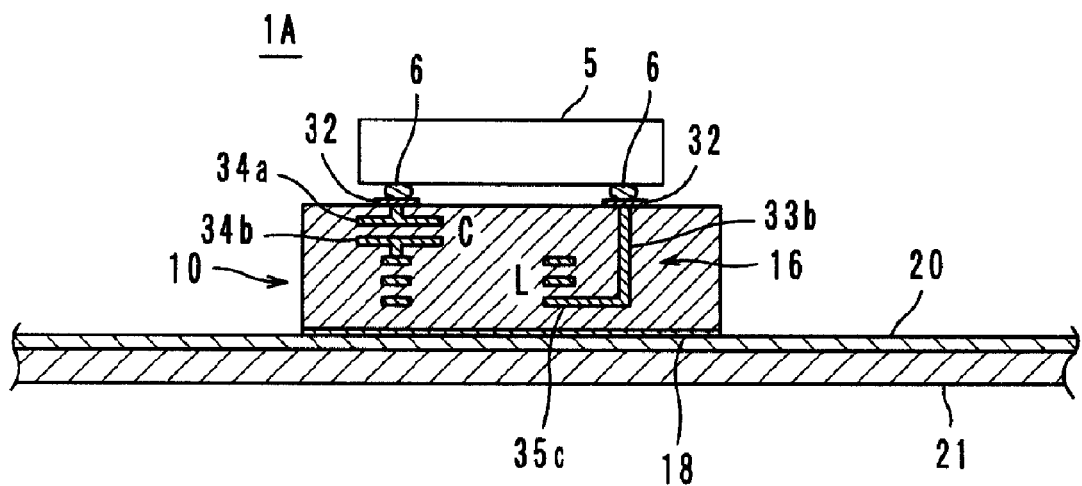
FIG. 2 is a sectional view showing the wireless IC device that includes the inductively coupled module according to the first preferred embodiment of the present invention.

As shown in FIGS. 1 and 2, an inductively coupled module 1A according to a first preferred embodiment of the present invention is included in a wireless IC device that includes a monopole-type radiation plate 20. The inductively coupled module 1A includes a wireless IC chip 5 and a feeder circuit substrate 10, the wireless IC chip 5 being mounted on the top surface of the feeder circuit substrate 10. The feeder circuit substrate 10 is adhered to the radiation plate 20 via an adhesive layer 18. The wireless IC chip 5 preferably includes a clock circuit, a logic circuit, and a memory circuit. Information is stored in the wireless IC chip 5, and the wireless IC chip 5 is electrically connected to a feeder circuit 16 that is provided in the feeder circuit substrate 10.

The feeder circuit substrate 10 is preferably a multilayer substrate in which the feeder circuit 16 is provided. The feeder circuit 16 functions as a circuit to supply a transmission signal having a predetermined frequency to the radiation plate 20 and/or a circuit to select a reception signal having a predetermined frequency from a signal received at the radiation plate 20 and to supply the reception signal to the wireless IC chip 5, and includes a resonant circuit that resonates at the frequency of transmission and reception signals.

Figure 3:
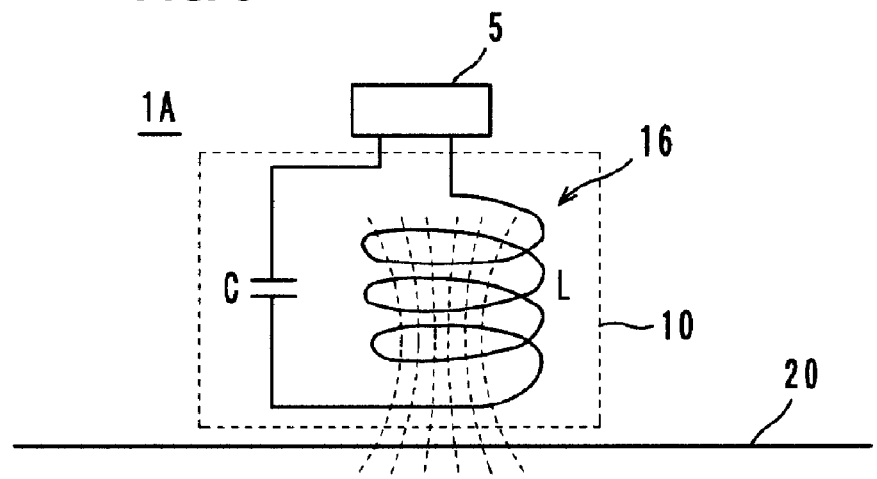
FIG. 3 is a diagram of an equivalent circuit of the inductively coupled module according to the first preferred embodiment of the present invention.

That is, as shown in FIG. 2 and FIG. 3, the feeder circuit 16 is configured to include an LC series resonant circuit that includes an inductance element L and a capacitance element C. The winding axis of a coil-shaped electrode included in the inductance element L is arranged to be perpendicular or substantially perpendicular to the radiation plate 20, and the feeder circuit 16 is primarily magnetically coupled to the radiation plate 20.

Figure 4:
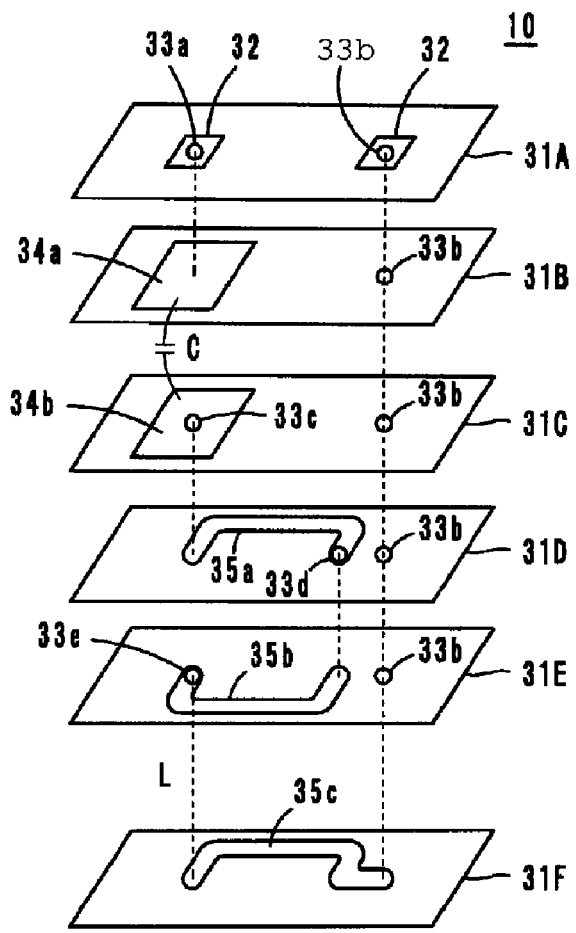
FIG. 4 is an exploded perspective view showing a feeder circuit substrate included in the inductively coupled module according to the first preferred embodiment of the present invention.

Specifically, as shown in an exploded perspective view of FIG. 4, the feeder circuit substrate 10 is preferably a substrate made by stacking, bonding, and press-bonding sheets 31A through 31F that are made of a biodegradable plastic described in detail below. The feeder circuit substrate 10 includes the sheet 31A on which two connection electrodes 32, a via hole conductor 33a, and a via hole conductor 33b are provided, the sheet 31B on which a capacitor electrode 34a and a via hole conductor 33b are provided, the sheet 31C on which a capacitor electrode 34b and via hole conductors 33c and 33b are provided, at least one sheet 31D on which a square-bracket-shaped electrode 35a and via hole conductors 33d and 33b are provided, at least one sheet 31E on which a square-bracket-shaped electrode 35b and via hole conductors 33e and 33b are provided, and the sheet 31F on which a square-bracket-shaped electrode 35c is provided.

By stacking the above-described sheets 31A through 31F, the feeder circuit 16 that includes the LC series resonant circuit is obtained. The LC series resonant circuit includes a capacitance element C that is connected in series with a helical inductance element L that has the winding axis perpendicular or substantially perpendicular to the radiation plate 20. The capacitor electrode 34a is connected to the connection electrode 32 via the via hole conductor 33a and to the wireless IC chip 5 via a solder bump 6. One end of the inductance element L is connected to the connection electrode 32 via the via hole conductors 33b and to the wireless IC chip 5 via the solder bump 6.

Among elements defining the feeder circuit 16, a transmission signal is fed from the inductance element L, which is preferably a coil-shaped electrode, to the radiation plate 20 via a magnetic field, and a reception signal from the radiation plate 20 is fed to the inductance element L via a magnetic field.

The radiation plate 20 is preferably a relatively long element that includes a magnetic film or a non-magnetic film, such as aluminum foil or copper foil, for example, to define an open-end-type metal body, and is disposed on a flexible resin film 21. This resin film 21 enables a wireless IC device to be adhered to various items, such as food, for example, and the wireless IC device is used in physical distribution management and other suitable uses. Preferably, a metal body itself, such as aluminum used in an item, can be utilized as a radiation plate.

The wireless IC device receives a radio-frequency signal (for example, the UHF frequency band) at the radiation plate 20 that is emitted from a reader/writer which is not shown, causes the feeder circuit 16 that is primarily magnetically coupled to the radiation plate 20 to resonate, and supplies only a reception signal having a predetermined frequency to the wireless IC chip 5. On one hand, predetermined energy is extracted from this reception signal and the frequency of the information stored in the wireless IC chip 5 is matched to a predetermined frequency at the feeder circuit 16 using this energy as a driving source. Thereafter, a transmission signal is sent to the radiation plate 20 from the inductance element L of the feeder circuit 16 through magnetic field coupling and the transmission signal is transmitted from the radiation plate 20 to the reader/writer.

Here, a biodegradable plastic from which the feeder circuit substrate 10 is made will be described. A biodegradable plastic is a plastic that naturally degrades, and plant-derived aliphatic plastics, natural plastics, and bioplastics are known biodegradable plastics. Plant-derived aliphatic plastics are plastics made from plants and a representative example is a polylactic resin, for example. Natural plastics are plastics whose physical properties have been improved by mixing chemosynthetic BDP (a biodegradable plastic) into amylum. MaterBi, manufactured by Novamont Corporation, Italy, and Cornpole, manufactured by Nihon Cornstarch Corporation can preferably be used, for example. Bioplastics are plastics obtained by giving bait (amylum, carbohydrates, and the like) to microorganisms which cause a biodegradable polymer to generate in the cell body, and followed by performing separation and purification. Recently, a biodegradable polymer has been generated in a plant cell using recombinant DNA technologies.

Since the feeder circuit substrate 10 is made of a biodegradable plastic, even if the inductively coupled module 1A is discarded with an item, the negative impact on the environment is greatly reduced. Moreover, when the inductively coupled module 1A is adhered to a package or a container whose contents are food or medicine, if the inductively coupled module 1A separates from the radiation plate 20, is mixed into food, and is accidentally swallowed, the negative impact on the human body is very small. A substrate of the wireless IC chip 5 can be formed of a biodegradable plastic, and in this case, the negative impact on nature or the human body can be more greatly reduced.

Here, it is preferable that an inductance element, a capacitance element, and other elements defining the feeder circuit 16 are made of a conductive paste that hardens at a low temperature, such as silver, for example, which is harmless to the human body when accidentally swallowed.

Moreover, although the coupling between the feeder circuit 16 and the radiation plate 20 primarily exists via a magnetic field, coupling via an electric field may exist (electromagnetic coupling).

Furthermore, the feeder circuit substrate 10 may be rigid or flexible. If it is rigid, handling during manufacture is facilitated, and if it is flexible, a wireless IC device can be easily adhered to an item.

In the first preferred embodiment (and similarly in other preferred embodiments), a resonant circuit may preferably also function as a matching circuit to match the impedance of the wireless IC chip 5 and the impedance of the radiation plate 20. Alternatively, the feeder circuit substrate 10 may preferably further include a matching circuit which includes an inductance element and a capacitance element and which is provided in addition to the resonant circuit. If a function of a matching circuit is added to a resonant circuit, the design of the resonant circuit tends to be relatively complicated. If a matching circuit is provided in addition to a resonant circuit, the resonant circuit and the matching circuit can each be independently designed.

Manufacture of the Substrate

Figure 5:
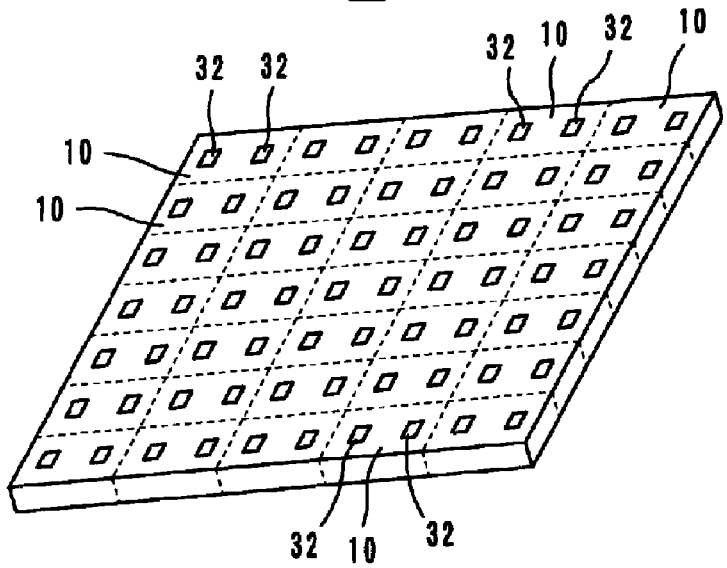
FIG. 5 is a perspective view showing the feeder circuit substrate in the process of manufacture.

As shown in FIG. 5, a parent substrate 10' is manufactured on which feeder circuits, each of which defines one unit, are arranged in a matrix, and thereafter the parent substrate 10' is cut as indicated by dotted lines into the individual feeder circuit substrates 10. In this manner, on a mass production line, a manufacturing method in which a parent substrate is cut into individual circuit substrates will be similar in other preferred embodiments described below.

Second Preferred Embodiment

Figure 6:
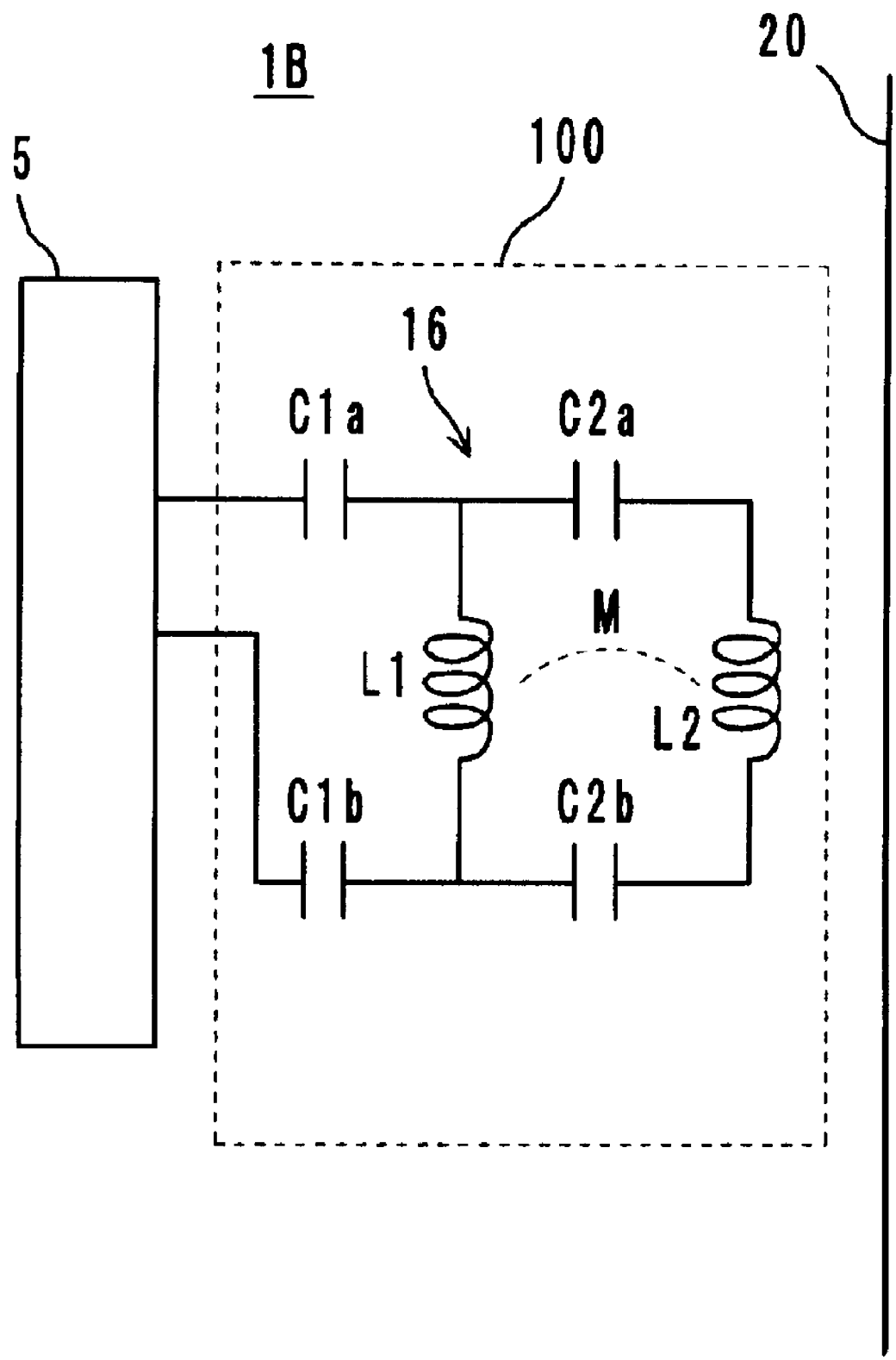
FIG. 6 is a diagram of an equivalent circuit of an inductively coupled module according to a second preferred embodiment of the present invention.

An inductively coupled module 1B according to a second preferred embodiment of the present invention includes an equivalent circuit shown in FIG. 6. The feeder circuit 16 includes inductance elements L1 and L2 that are magnetically coupled to each other in a common mode. The inductance element L1 is connected to the wireless IC chip 5 via capacitance elements C1a and C1b, and is connected in parallel with the inductance element L2 via capacitance elements C2a and C2b. In other words, the feeder circuit 16 is configured to include an LC series resonant circuit that includes the inductance element L1 and the capacitance elements C1a and C1b and an LC series resonant circuit that includes the inductance element L2 and the capacitance elements C2a and C2b. The LC series resonant circuits are coupled by a mutual inductance M shown in FIG. 6. Both of the inductance elements L1 and L2 are magnetically coupled to the radiation plate 20.

Figure 7:
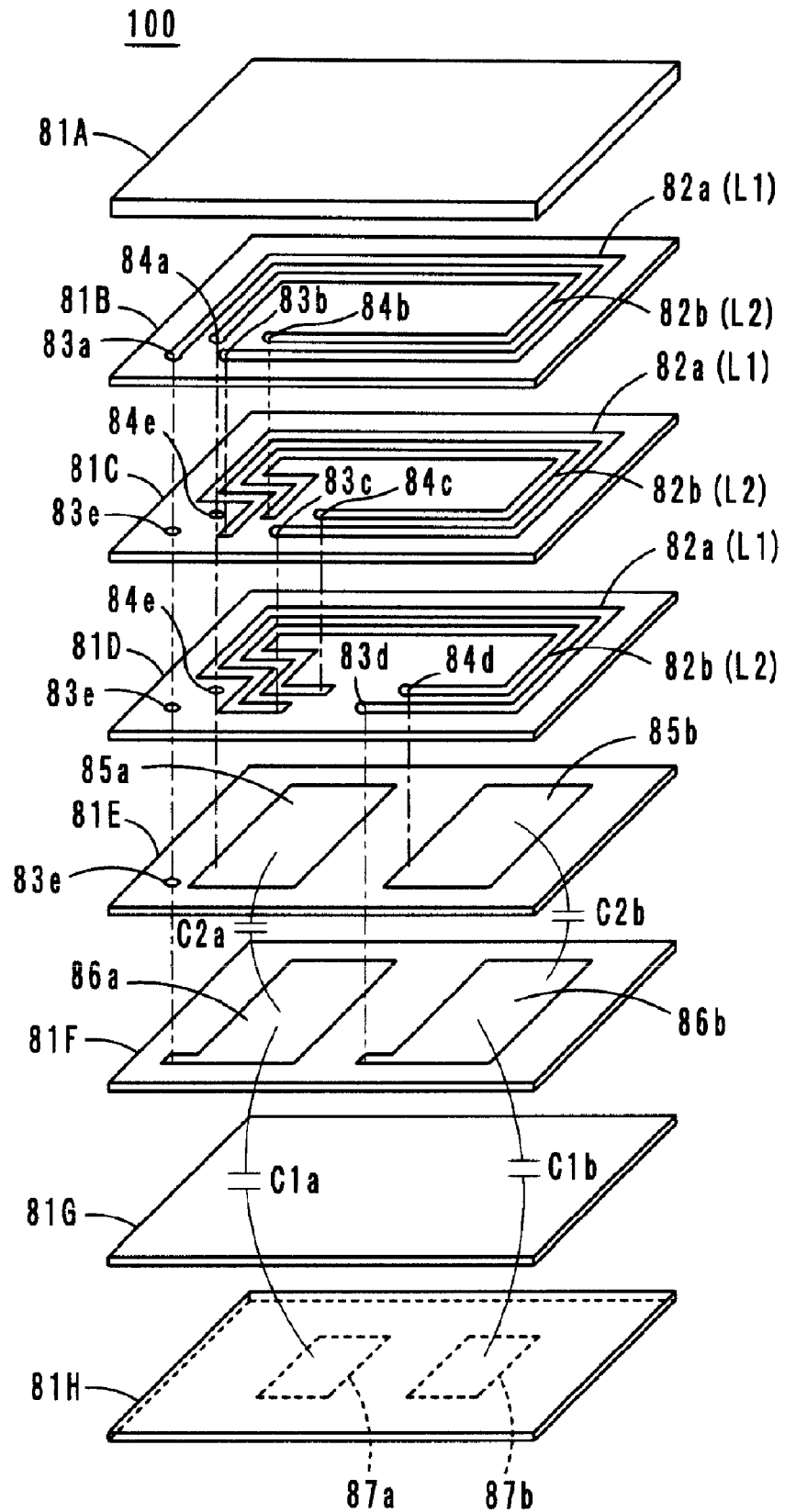
FIG. 7 is an exploded perspective view showing a feeder circuit substrate included in the inductively coupled module according to the second preferred embodiment of the present invention.

Specifically, as shown in an exploded perspective view of FIG. 7, a feeder circuit substrate 100 is made by stacking, bonding, and press-bonding sheets 81A through 81H that are made of the above-described biodegradable plastic. The feeder circuit substrate 100 includes the sheet 81A which is plain, the sheet 81B on which ring-shaped electrodes 82a and 82b and via hole conductors 83a, 83b, 84a, and 84b are provided, the sheet 81C on which ring-shaped electrodes 82a and 82b and via hole conductors 83c, 84c, 83e, and 84e are provided, the sheet 81D on which ring-shaped electrodes 82a and 82b and via hole conductors 83d, 84d, 83e, and 84e are provided, the sheet 81E on which capacitor electrodes 85a and 85b and the via hole conductor 83e are provided, the sheet 81F on which capacitor electrodes 86a and 86b are provided, the sheet 81G which is plain, and the sheet 81H. Capacitor electrodes 87a and 87b are provided on the back surface of the sheet 81H.

By stacking the above-described sheets 81A through 81H, the ring-shaped electrodes 82a are connected via the via hole conductors 83b and 83c, so that the inductance element L1 is formed, and the ring-shaped electrodes 82b are connected via the via hole conductors 84b and 84c, so that the inductance element L2 is provided. The capacitance element C1a is defined by the capacitor electrodes 86a and 87a, and the capacitor electrode 86a is connected to one end of the inductance element L1 via the via hole conductors 83e. The capacitance element C1b is defined by the capacitor electrodes 86b and 87b, and the capacitor electrode 86b is connected to the other end of the inductance element L1 via the via hole conductor 83d. Moreover, the capacitance element C2a is defined by the capacitor electrodes 85a and 86a, and the capacitor electrode 85a is connected to one end of the inductance element L2 via the via hole conductors 84e. The capacitance element C2b is defined by the capacitor electrodes 85b and 86b, and the capacitor electrode 85b is connected to the other end of the inductance element L2 via the via hole conductor 84d.

Operations and advantages that are achieved by the second preferred embodiment are substantially the same as those of the first preferred embodiment. By making the feeder circuit substrate 100 and/or the wireless IC chip 5 of a biodegradable plastic, the negative impact on the environment and the human body can be greatly reduced. Moreover, this inductively coupled module 1B receives a radio-frequency signal (for example, a frequency band of 2 through 30 MHz of the UHF frequency band) at the radiation plate 20 that is emitted from a reader/writer which is not shown, causes the feeder circuit 16 (an LC series resonant circuit that includes the inductance element L1 and the capacitance elements C1a and C1b and an LC series resonant circuit that includes the inductance element L2 and the capacitance elements C2a and C2b) to resonate, the feeder circuit 16 being primarily magnetically coupled to the radiation plate 20, and supplies only a reception signal having a predetermined frequency band to the wireless IC chip 5. Predetermined energy is extracted from this reception signal and the frequency of the information stored in the wireless IC chip 5 is matched to a predetermined frequency at the feeder circuit 16 using this energy as a driving source. Thereafter, a transmission signal is sent to the radiation plate 20 from the inductance elements L1 and L2 of the feeder circuit 16 through magnetic field coupling and the transmission signal is transmitted from the radiation plate 20 to the reader/writer.

Figure 8:
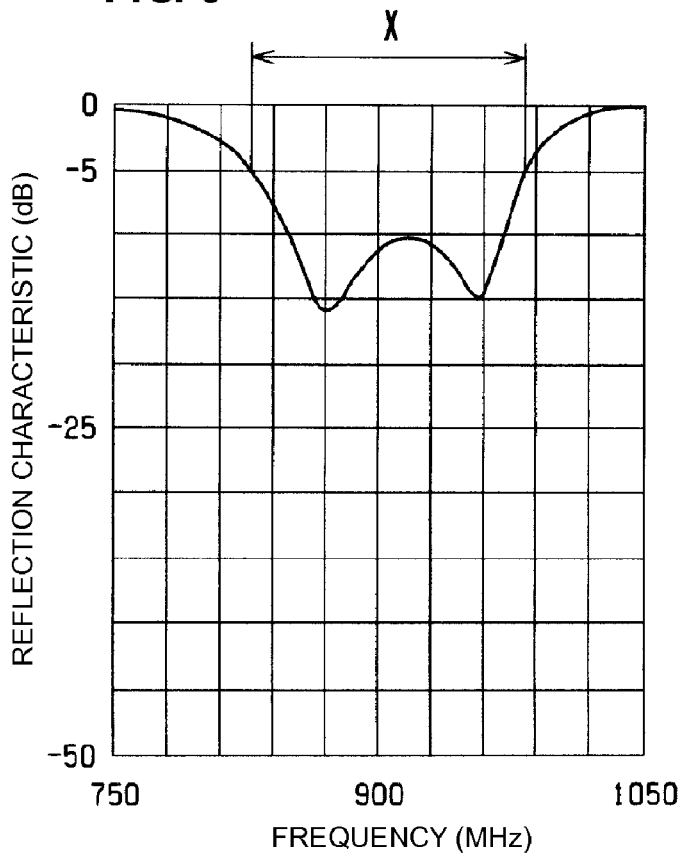
FIG. 8 is a graph showing the reflection characteristic of the inductively coupled module according to the second preferred embodiment of the present invention.

In particular, in the second preferred embodiment, as shown in FIG. 8, a significantly wide frequency band is achieved whose bandwidth X (a bandwidth of about −5 dB, for example) in the reflection characteristic is preferably greater than or equal to about 150 MHz, for example. This is due to the fact that the feeder circuit 16 includes a plurality of LC resonant circuits in a multistage arrangement, the LC resonant circuits including the inductance elements L1 and L2 that are magnetically coupled to each other with high degree of coupling. Moreover, since the capacitance elements C1a and C1b are inserted after the wireless IC chip 5, surge withstand performance is improved.

Furthermore, in the second preferred embodiment, even if the feeder circuit substrate 100 including a matching circuit that is made from a material whose temperature characteristic is not particularly good, such as a biodegradable plastic, a change in resonance frequency due to temperature can be absorbed because a wider band is achieved.

Third Preferred Embodiment

Figure 9:
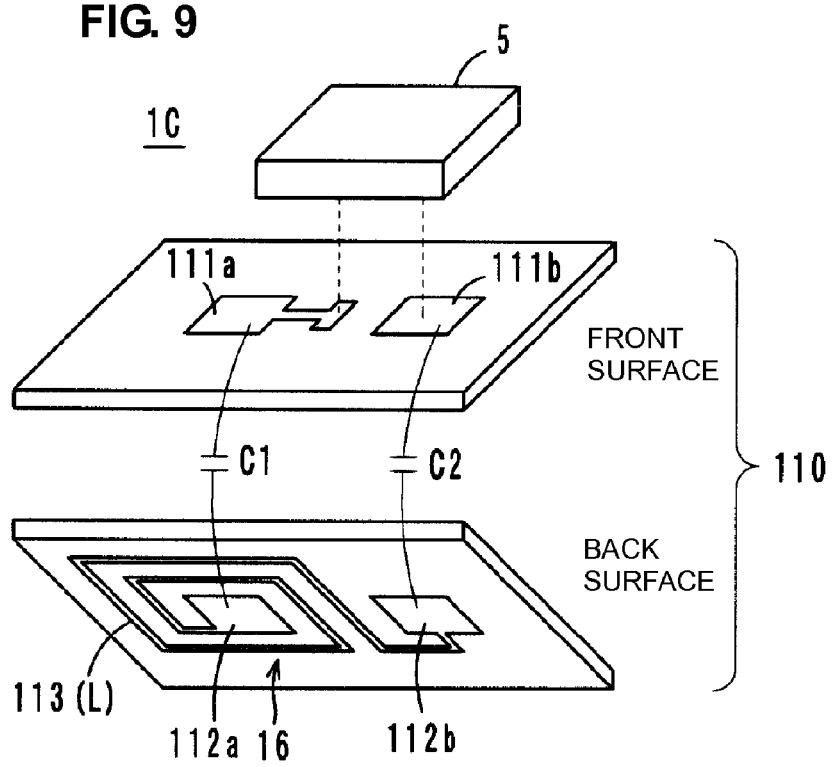
FIG. 9 is an exploded perspective view showing an inductively coupled module according to a third preferred embodiment of the present invention.
Figure 10:
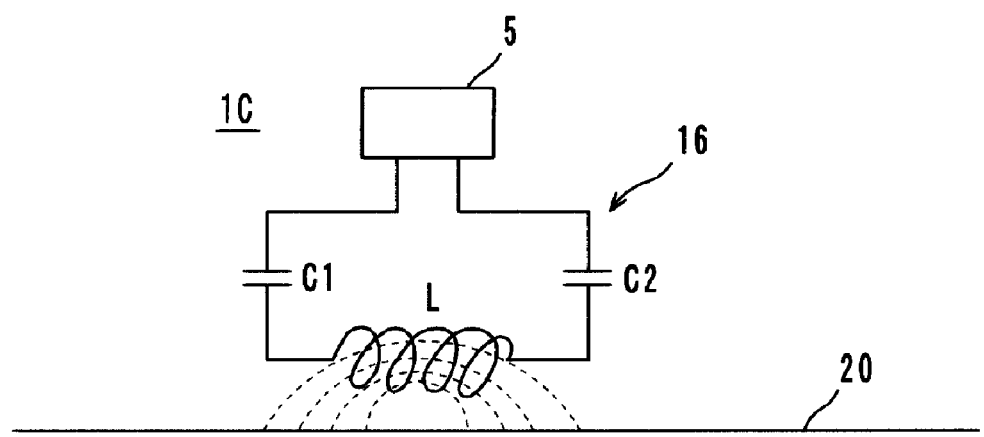
FIG. 10 is a diagram of an equivalent circuit of the inductively coupled module according to the third preferred embodiment of the present invention.

As shown in FIG. 9, an inductively coupled module 1C according to a third preferred embodiment of the present invention includes a feeder circuit substrate 110 which is a single-layer substrate made of a biodegradable plastic described above. An equivalent circuit of the inductively coupled module 1C is as shown in FIG. 10. The feeder circuit 16 includes an LC series resonant circuit in which the capacitance elements C1 and C2 are connected to a corresponding one of the ends of the inductance element L. Capacitor electrodes 111a and 111b are preferably provided on the front surface of the feeder circuit substrate 110, and capacitor electrodes 112a and 112b and a spiral-shaped electrode 113 are preferably provided on the back surface of the feeder circuit substrate 110. The capacitance element C1 is defined by the capacitor electrodes 111a and 112a, and the capacitance element C2 is defined by the capacitor electrodes 111b and 112b.

Operations and advantages that are achieved by the third preferred embodiment are substantially the same as those achieved by the first preferred embodiment and those achieved by the second preferred embodiment. By making the feeder circuit substrate 110 and/or the wireless IC chip 5 of a biodegradable plastic, the negative impact on the environment and the human body can be greatly reduced. Moreover, this inductively coupled module 1C receives a radio-frequency signal (for example, in the UHF frequency band) at the radiation plate 20 that is emitted from a reader/writer which is not shown, causes the feeder circuit 16 (an LC series resonant circuit that includes the inductance element L and the capacitance elements C1 and C2) to resonate, the feeder circuit 16 being primarily magnetically coupled to the radiation plate 20, and supplies only a reception signal having a predetermined frequency band to the wireless IC chip 5. Predetermined energy is extracted from this reception signal and the frequency of the information stored in the wireless IC chip 5 is matched to a predetermined frequency by the feeder circuit 16 using this energy as a driving source. Thereafter, a transmission signal is sent to the radiation plate 20 from the inductance element L of the feeder circuit 16 through magnetic field coupling and the transmission signal is transmitted and forwarded from the radiation plate 20 to the reader/writer.

Fourth Preferred Embodiment

Figure 11:
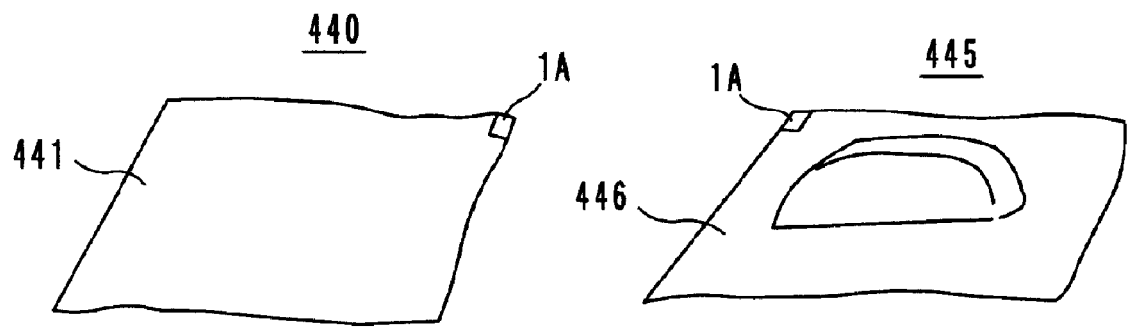
FIG. 11 is a perspective view showing an item with an inductively coupled module according to a fourth preferred embodiment of the present invention.

As shown in FIG. 11, a fourth preferred embodiment of the present invention utilizes aluminum films 441 and 446 of packages 440 and 445 of medicine as radiation plates. The package 440 is used for medicine in powder form, and the package 445 is used for medicine in tablet form, for example. In the inductively coupled module 1A (may be 1B or 1C), a feeder circuit is inductively coupled to the aluminum films 441 and 446 and stays in radio contact with a reader/writer of an RFID system. In the fourth preferred embodiment, the inductively coupled module 1A can be used to identify whether medicine is genuine or counterfeit in the package, in addition to being used in physical distribution management.

An inductively coupled module according to the present invention and an item that includes the inductively coupled module are not limited to the above-described preferred embodiments. Various changes can be made within the scope of the invention.

For example, the structure of a feeder circuit substrate and the circuit configuration of a feeder circuit are arbitrary, and an inductively coupled module can preferably be adhered to any type of items that are distributed.

As described above, the present invention is useful for inductively coupled modules, and is particularly advantageous in that a negative impact of the module on the environment and the human body can be prevented.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An item including an inductively coupled module, wherein
    the item is one of a package or a container for holding food, drink, or medicine;
    the item includes a metal element that defines a radiation plate;
    the inductively coupled module includes a wireless IC chip and a feeder circuit substrate connected to the wireless IC chip, the feeder circuit substrate including a feeder circuit;
    the feeder circuit of the inductively coupled module is coupled to the metal element of the item via electromagnetic coupling; and
    at least one of the wireless IC chip and the feeder circuit substrate is made of a biodegradable plastic.

2. The item according to claim 1, wherein the biodegradable plastic is one of a plant-derived aliphatic plastic, a natural plastic, and a bioplastic.

3. The item according to claim 1, wherein the feeder circuit substrate is a multilayer substrate including a plurality of stacked biodegradable plastic layers.

4. The item according to claim 1, wherein the feeder circuit substrate is a single-layer substrate made of a biodegradable plastic.

5. The item according to claim 1, wherein the feeder circuit substrate is flexible.

6. The item according to claim 1, wherein
    the feeder circuit includes a resonant circuit that includes an inductance element;
    the feeder circuit is arranged to supply a transmission signal having a predetermined frequency or to receive a reception signal having the predetermined frequency; and
    the resonant circuit is arranged to resonate at the predetermined frequency.

* * * * *